United States Patent
Strandberg et al.

(12) 
(10) Patent No.: US 6,323,435 B1
(45) Date of Patent: *Nov. 27, 2001

(54) LOW-IMPEDANCE HIGH-DENSITY DEPOSITED-ON-LAMINATE STRUCTURES HAVING REDUCED STRESS

(75) Inventors: Jan I. Strandberg, Cupertino; David J. Chazan, Palo Alto; Michael P. Skinner, San Jose, all of CA (US)

(73) Assignee: Kulicke & Soffa Holdings, Inc., Willow Grove, PA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/363,959

(22) Filed: Jul. 29, 1999

Related U.S. Application Data

(63) Continuation-in-part of application No. 09/191,594, filed on Nov. 13, 1998, now Pat. No. 6,262,579, and a continuation-in-part of application No. 09/172,178, filed on Oct. 13, 1998, and a continuation-in-part of application No. 09/127,579, filed on Jul. 31, 1998, now Pat. No. 6,203,967, and a continuation-in-part of application No. 09/127,580, filed on Jul. 31, 1998, now Pat. No. 6,165,892.

(60) Provisional application No. 60/097,140, filed on Aug. 18, 1998, and provisional application No. 60/097,169, filed on Aug. 18, 1998.

(51) Int. Cl.[7] ............................... H05K 1/03; H05K 1/16
(52) U.S. Cl. ........................ 174/255; 174/259; 174/260; 174/261; 257/702; 361/760; 361/762; 361/774
(58) Field of Search .................................. 174/255, 259, 174/258, 261, 256, 52.1, 251, 260; 361/760, 751, 718, 719, 762, 773, 774; 257/778, 698, 692, 702, 669

(56) References Cited

U.S. PATENT DOCUMENTS

| | | |
|---|---|---|
| 4,641,222 * | 2/1987 | Derfiny et al. ............... 361/768 |
| 4,713,494 | 12/1987 | Oikawa et al. ................. 174/68.5 |
| 5,109,601 * | 5/1992 | McBride ........................... 29/840 |
| 5,194,933 | 3/1993 | Miyagi ............................ 257/753 |
| 5,296,649 | 3/1994 | Kosuga et al. .................. 174/250 |
| 5,338,975 | 8/1994 | Cole, Jr. et al. ............... 257/750 |
| 5,373,627 | 12/1994 | Grebe ............................. 29/841 |
| 5,416,667 | 5/1995 | Ichikawa et al. ............... 361/816 |
| 5,455,459 | 10/1995 | Fillion et al. ................... 257/760 |
| 5,473,120 | 12/1995 | Ito et al. ......................... 174/264 |
| 5,487,218 | 1/1996 | Bhatt et al. ....................... 29/852 |
| 5,488,542 * | 1/1996 | Ito ................................... 361/793 |
| 5,670,421 | 9/1997 | Nishitani et al. ............... 437/192 |
| 5,677,045 * | 10/1997 | Nagai et al. .................... 442/294 |
| 5,723,822 | 3/1998 | Lien ................................ 174/250 |
| 5,756,396 | 5/1998 | Lee et al. ........................ 438/622 |
| 5,804,771 * | 9/1998 | McMahon et al. ............. 174/255 |
| 5,833,903 | 11/1998 | Centofante ..................... 264/155 |
| 5,834,848 * | 11/1998 | Iwasaki .......................... 257/778 |
| 5,886,398 | 3/1999 | Low et al. ...................... 257/667 |
| 5,891,795 | 4/1999 | Arledge et al. ................. 438/613 |
| 6,028,364 * | 2/2000 | Ogino et al. ................... 257/778 |
| 6,037,044 * | 3/2000 | Giri et al. ....................... 428/209 |
| 6,050,832 * | 4/2000 | Lee et al. ......................... 439/91 |
| 6,127,724 * | 10/2000 | DiStefano ...................... 257/675 |
| 6,165,892 * | 12/2000 | Chazan et al. ................. 438/623 |

FOREIGN PATENT DOCUMENTS

405220892 * 8/1993 (JP) .

* cited by examiner

*Primary Examiner*—Jeffrey Gaffin
*Assistant Examiner*—J B Patel
(74) *Attorney, Agent, or Firm*—Townsend and Townsend and Crew LLP

(57) ABSTRACT

Low-impedance high density deposited-on-laminate (DONL) structures having reduced stress features reducing metallization present on the laminate printed circuit board. In this manner, reduced is the force per unit area exerted on the dielectric material disposed adjacent to the laminate material that is typically present during thermal cycling of the structure.

18 Claims, 7 Drawing Sheets

LOW-IMPEDANCE HIGH-DENSITY DEPOSITED-ON-LAMINATE STRUCTURES HAVING REDUCED STRESS

CROSS-REFERENCE TO RELATED PATENT APPLICATIONS

This application is a non-provisional application of U.S. provisional patent application No. 60/097,140, filed Aug. 18, 1998 entitled "EXTENDED LAMINATE STRUCTURE AND PROCESS", and No. 60/097,169, filed Aug. 18, 1998 entitled "THICKNESS OF COPPER", both having Jan Strandberg identified as an inventor. This application is also a continuation-in-part of and claims priority from non-provisional applications Ser. No. 09/127,579, now U.S. Pat. No. 6,203,967 filed Jul. 31, 1998 entitled "METHOD FOR CONTROLLING STRESS IN THIN FILM LAYERS DEPOSITED OVER A HIGH DENSITY INTERCONNECT COMMON CIRCUIT BASE" having Jan Strandberg and Scott Westbrook as inventors; now U.S. Pat. No. 6,203, 967; Ser. No. 09/172,178 filed Oct. 13, 1998 entitled "DEPOSITED THIN FILM BUILD-UP LAYER DIMENSIONS AS A METHOD OF RELIEVING STRESS IN HIGH DENSITY INTERCONNECT PRINTED WIRING BOARD SUBSTRATES" having Jan Strandberg and James L. Lykins as inventors; and Ser. No. 09/191,594, now U.S. Pat. No. 6,262,579 filed Nov. 13, 1998 entitled "AN IMPROVED METHOD AND STRUCTURE FOR DETECTING OPEN VIAS IN HIGH DENSITY INTERCONNECT SUBSTRATES" having David J. Chazan and James L. Lykins as inventors; and Ser. No. 09/127,580, now U.S. Pat. No. 6,165,892 filed Jul. 31, 1998 entitled "AN IMPROVED METHOD OF PLANARIZING THIN FILM LAYERS DEPOSITED OVER A PRINTED WIRING BOARD SUBSTRATE" having David Chazan, Ted Chen, Todd Kaplan and James L. Lykins as inventors; The provisional U.S. patent applications Ser. Nos. 60/097,140 and 60/097,169 and U.S. non-provisional application Ser. Nos., 09/127,579, 09/172,178, and 09/191,594 are incorporated by reference in their entirety.

BACKGROUND OF THE INVENTION

The present invention relates to the use of thin-film deposition technology to create a high speed structure having high density interconnects formed on a conventional printed wiring board substrate. More specifically, the present invention pertains to an improved method for minimizing the effects of accumulated stress between the printed wiring board substrate and overlying deposited thin film layers while maintaining a relatively overall low impedance in the resulting structure. The method of the present invention is also useful for creating interconnections on high density daughter boards that carry packaged devices.

The semiconductor industry continues to produce integrated circuits of increasing complexity and increasing density. The increased complexity of some of these integrated circuits has, in turn, resulted in an increased number of input/output pads on the circuit chips. At the same time, the increased density of the chips has driven the input/output pad pitch downward. The combination of these two trends has been a significant increase in the connector pin wiring density needed to connect the chips to packages that interface with the outside world and interconnect the chips to other integrated circuit devices.

A number of different technologies have been developed to interconnect one or more integrated circuits and related components. One such technology is based on traditional printed wiring board (PWB) technology that found wide use during the period in which integrated circuits were packaged in surface mount devices like quad flat packs (QFPs). PWB technology typically uses copper and insulating dielectric material sub-laminates as building blocks to create the required interconnect structures. The process of forming a copper conductive pattern on the sub-laminate in PWB technology typically includes forming a dry film of photo resist over the copper layer, patterning and developing the photo resist to form an appropriate mask and selectively etching away the unwanted copper, thereby leaving the desired patterned conductive layer.

Substrates used in PWB technology can be manufactured in large area panels providing efficiencies that lower the costs of production. Interconnect solutions using this technology generally have relatively good performance characteristics because of the copper and low dielectric constant (e.g. less than or equal to 4.0) employed. The printed wiring board industry, however, has not kept pace with the advances in semiconductor manufacturing in terms of pad density and pad count. As a result, there is a capability gap between semiconductor manufacturers and interconnect printed wiring board manufactures.

In some applications, two or more pieces of laminate are laminated together to form a final structure. Interconnection between laminated layers can be provided by through-holes mechanically drilled and then plated. The drilling process is relatively slow and expensive and can require a large amount of board space. As the number of interconnect pads increases, an increased number of signal layers is often used to form the interconnect structure. Because of these limitations, the conventional printed wiring board technology needs to go to a large number of metal layers (e.g. greater than eight layers) for some of the applications in high density integrated circuit packaging and daughter board fabrication. Utilizing a large number of layers in this context generally increases cost and decreases electrical performance. Also, the pad size limits the wiring density on any given layer with this technology. Thus, PWB technology, while useful for some applications, is not capable of providing the connection density required in other applications.

To improve the interconnect density of PWB technology, an advanced printed wiring board technology approach called build-up multi-layer has been developed. In this technology a traditional printed wiring board core is the starting point. Standard drilling and plating techniques form plated through-holes in the core. From the basic core this build-up approach has many variations. Typically a dielectric layer approximately 50 microns thick is laminated to both the top and bottom major surfaces of the conventionally fabricated printed wiring board substrate. Vias are made in the build-up layer by laser ablation, photo mask/plasma etch, or other known methods. An electrodeless seeding step is then done prior to a panel plating step that metalizes both the upper and lower surfaces. Subsequent masking and wet etching steps then define a desired conductive pattern over the laminated dielectric layers.

This technology offers a large improvement in terms of density over standard PWB technology without build-up layers; however, such build-up boards require multiple layers in order to meet the developing high density packaging and daughter board requirements. Thus this technology still has limitations.

Another conventional approach used to package high density interconnect applications uses cofired ceramic substrates and is referred to generally as multilayer ceramic or MLC technology. Basically, MLC technology involves rolling a ceramic mix into sheets, drying the sheets, punching vias, screening the rolled sheets with a metal paste representing the trace pattern on the surface of the ceramic, stacking and laminating all the layers together, then cofiring at a high temperature (e.g. greater than 850° C.) to achieve the desired interconnections.

MLC construction has found extensive use in high density and high reliability products where the robustness of the high density interconnect package outweighs the cost considerations. The ability to create a hermetic seal in the ceramic improves the ability to withstand environments not tolerable to conventional printed wiring board technology. While this technology is capable of high density packaging applications (e.g. greater than 1000 pads), it is also very costly. Additionally, performance characteristics, such as signal propagation time, are impacted due to the relatively high dielectric constant (e.g. between 5.0 and 9.0) of the ceramic material. MLC technology provides higher connection density than PWB technology, but is not capable of providing the connection density required for some of today's high density interconnect applications.

A third approach which the high density interconnect and packaging industry has moved to addressing these high density interconnect applications using thin film deposition technology. This is sometimes referred to as deposited on laminate or D/L technology in a broad sense, as well as MCM-D or MCM deposition technology in a multichip module context. In some applications, such D/L technology includes forming and patterning thin film conductive traces over large substrates such as the laminated printed wiring boards discussed above. Such large substrates may have a surface area of 40 centimeters by 40 centimeters or more, thereby providing efficiencies that lower the costs of production.

D/L technology utilizes a combination of low cost printed wiring board structures, with or without the use of the build-up multi-layers on the printed wiring board, as a starting point to meet the high density and low cost interconnect requirements. This combination of existing conventional high volume printed wiring board technology and advanced thin film deposition technology represents a significant economic advantage and density improvement as compared to the previously discussed PWB and MLC technologies.

One significant feature of D/L technology is that it creates a high interconnect density substrate using thin film processes on only one side of the printed wiring board. The high density interconnects are formed by depositing alternating insulating and conducting thin film layers. The total thickness of several of these deposited layers is less than the thickness of a single traditional build-up layer. This eliminates the need for balancing the build-up layers on both top and bottom to prevent warpage of the substrate.

The D/L process involves first laying down a layer of an insulating dielectric on the top surface of a printed wiring board substrate, depositing a conductive material over the dielectric layer, creating a circuit pattern in the conductive material, then depositing the next insulating and conductive layers. The various layers so created are connected through vias constructed using a variety of known techniques such as wet chemical etch, photo expose and develop or laser ablation. In this way a three dimensional deposited laminated structure is achieved enabling high density interconnect patterns to be fabricated in small physical areas.

Despite the definite advantages of D/L technology, there are potential problems that may result in failure modes and performance limitations if the overlying deposited thin film layers are not properly implemented. One important aspect of the implementation of deposited thin film layers on the surface of printed wiring board substrates is the control of mechanical stresses generated by both processing and operation. Key to control of the these stresses is understanding their sources and providing methods and structures that minimize them.

The stresses in a high density interconnect structure result from a number of sources. These sources include differences in the coefficients of thermal expansion between dielectric, laminate and conductive materials, physical handling, and water vapor absorbed by the polymers of the dielectric materials in both the printed wiring board substrate and the deposited thin film build-up layers. Each of these stresses can be a source of failures such as cracking of the dielectric material and cracking and delamination of the conductive material. In either of these cases opens and shorts can destroy the functionality of the completed high density interconnect structure. The stresses associated with physical handling can be substantially eliminated through proper design of processes, operator training, and proper fixture design. Stresses related to thermal changes, however, must be minimized through proper design of the high density interconnect structure.

The stresses linked to thermal changes occur for several reasons, but the result is that stress accumulates at the interfaces between the metal conducting features and the surrounding dielectric of the high density interconnect structure. If enough stress accumulates a crack will develop that, if uninterrupted, may propagate through the overlying deposited thin film layers creating failures. One attempt to reduce the stress included adding a filler to the dielectric layer when being deposited. The filler acted to increase the durability of the dielectric layer when subjected to stresses resulting from thermal mismatch in the materials, by decreasing the brittleness of the same. Typical fillers include silica compounds, such as silicon dioxide, silica glass and the like. In addition rubber compounds may be employed as fillers. A problem encountered with increasing the filler content of the dielectric layer is that the dielectric constant is proportional to the amount of filler included in the layer. As a result, the less durable the dielectric layer, the higher the impedance associated with the structure formed with such a layer.

What is needed, therefore, is a low-impedance high-density deposited-on-laminate structure having reduced stress.

SUMMARY OF THE INVENTION

A low-impedance high density deposited-on-laminate structure having reduced stress features reduced metallization present on the laminate printed circuit board. In this manner, reduced is the force per unit area exerted on the dielectric material disposed adjacent to the laminate material which is typically present during thermal cycling of the structure. Specifically, the laminate printed circuit board has two opposed major surfaces, and a conductive wiring pattern is formed on one of the two opposed major surfaces. The conductive wiring pattern typically includes one or more conductive traces. Each conductive trace has at least two sides extending from a common area, defining a junction, transversely to one another. One of the two sides terminates proximate to the first surface. To reduce the force exerted on the dielectric material, the method includes reducing an area of one of the two sides of the conductive trace.

In one embodiment, the area is reduced by increasing the area of the junction. Considering the two sides typically extend substantially orthogonally to one another, the junction formed thereby defines a right angle. The area of the junction is increased by providing the same with an arcuate profile. The increase in surface area reduces the force per unit area exerted on the dielectric material disposed adjacent to the conductive trace.

In another embodiment, the area of two of the three exposed sides of the conductive trace is reduced by polishing the conductive wiring pattern to reduce a height of the conductive trace, measured from the first major surface, to be within a range of 10 to 20 microns, inclusive. In this manner, the effects of the difference in coefficients of thermal expansion between the conductive wiring pattern and the dielectric material is reduced. During thermal cycling the dielectric material expands and contracts at a greater rate than the conductive wiring pattern. By reducing the spacing between the first surface and the dielectric material disposed adjacent to the conductive wiring pattern, the force exerted by the conductive trace is reduced. It should be recognized, however, that the two embodiments may employed in a single structure to further reduce the overall stresses in the same.

In yet another embodiment of the present invention, the stress in the structure may be reduced in the presence of through-holes extending between the opposed major surfaces. Typically, such through-holes are coated with a conductive material and include an epoxy filler disposed therein. Recognizing that the epoxy filler expands and contracts isotropically, it has been found that forces exerted on the conductive material is exerted on conductive traces, resulting in the same causing failures in the dielectric material. To avoid this problem, the epoxy filler is selected to have a coefficient of thermal expansion in the range of 20–25×10$^{-6}$/° C.

These and other embodiments of the present invention along with many of its advantages and features are described in more detail in conjunction with the text below and attached figures.

DESCRIPTION OF THE SPECIFIC EMBODIMENTS

Figure 1:
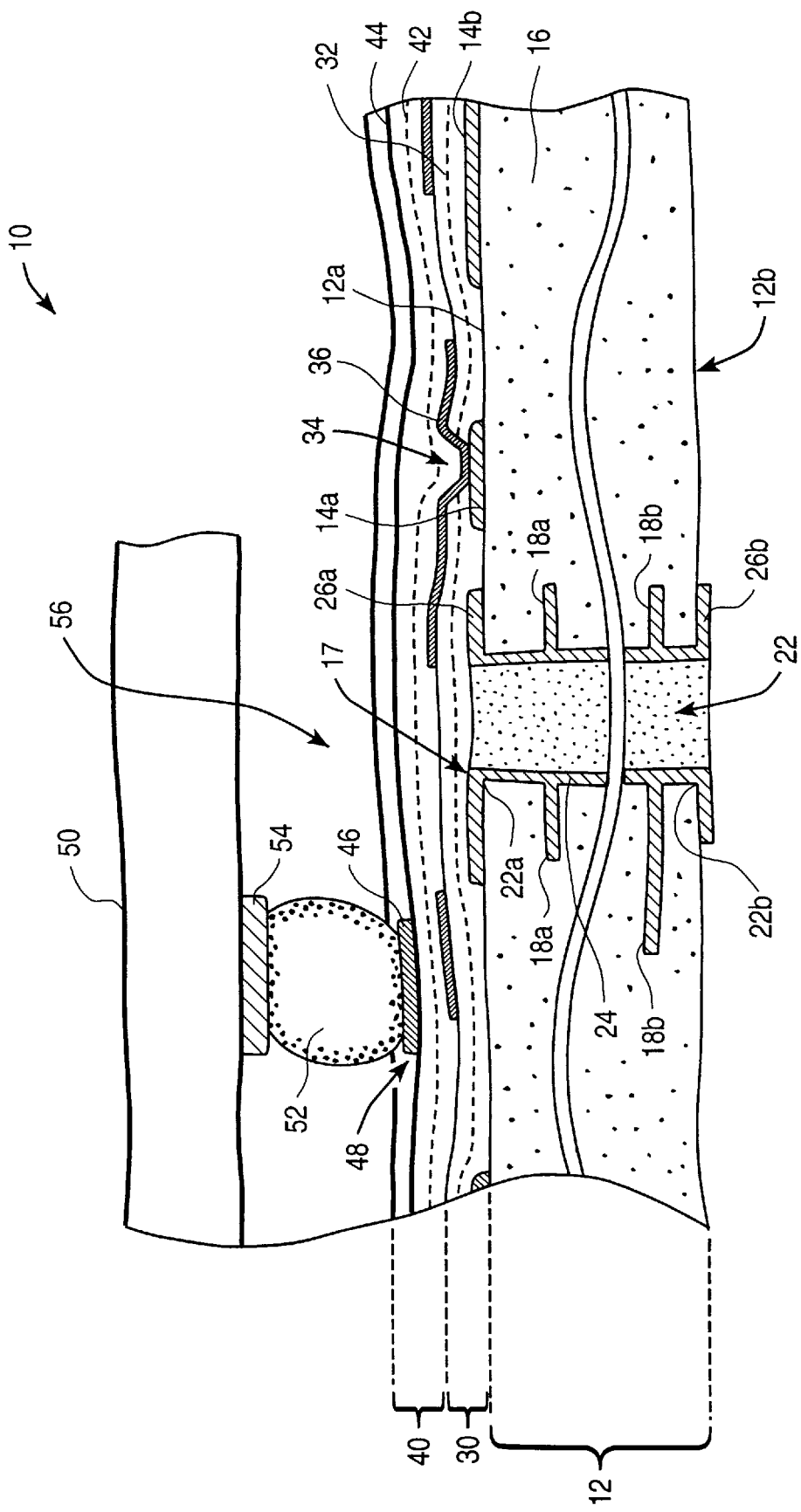
FIG. 1 is a cross-sectional view of an exemplary structure formed in accordance with the present invention.

FIG. 1 shows an exemplary deposited-on-laminate (D/L) structure 10 in accordance with the present invention that includes a laminate board 12 having two opposed major surfaces 12a and 12b with a conductive wiring pattern disposed thereon, shown generally as conductive traces 14a and 14b. The region of the laminate board 12 disposed between the surfaces 12a and 12b is laminate resin insulator 16 that has conductive paths, shown generally as 18a and 18b, embedded therein. Typically a through-hole 22 is formed in the laminated board 12, extending through the resin insulator between opposed apertures 22a and 22b positioned in opposed surfaces 12a and 12b, respectively. Conductive material 24 is present within the through-hole 22 and conforms to the shape thereof. In the present example, the conductive material forms a hollow cylinder. Typically, one or more of the conductive paths 18a and 18b are in electrical communication with the conductive material 24. Disposed adjacent to the surface 12a is a conductive pad 26a that surrounds the aperture 22a. Also present on the surface 22b may be another conductive pad 26b, surrounding the aperture 22b. With this structure, the conductive material 24 places the conductive pads 26a and 26b in electrical communication with each other and the conductive paths 18a and 18b. Although the conductive elements of the structure 10 may be formed from any conductive or semi-conductive material known, it is preferred that the same be formed from a metallic material, such as copper containing material.

Disposed adjacent to the laminate board 12 is a build-up dielectric layer 30 that includes dielectric material 32 positioned adjacent to surface 12a. A via 34 is formed in the dielectric material 32 to allow electrical communication between opposing sides of the build-up layer 30. To that end, a conductive contact 36 is disposed within the via 34 that is in electrical communication with conductive trace 14a.

Disposed adjacent to the build-up layer 30 is an extended laminate layer 40 that includes a plurality of dielectric layers 42 and 44. A conductive contact 46 is disposed between layers 42 and 44. A via 48 is formed through dielectric layer 42 facilitating electrical connections between conductive contact 46 and a circuit positioned adjacent to the extended laminate layer 40. As shown, a circuit 50 is in electrical communication with the conductive contact 46 via a solder ball 52 connected to a bond pad 54. Typically, the circuit 50 is spaced-apart from the extended laminate layer 40, defining a gap 56 therebetween. Mechanical support is provided to the circuit 50 having underfill, such as epoxy or some other suitable material, placed in the gap 56.

A problem solved by the present invention concerned stress failures at the conductive trace/dielectric material interface. For ease of discussion, the stress failures occurring within build-up layer 30 are discussed with the understanding that the present invention can be used to reduce the stress at any conductive material material/dielectric interface. Specifically, it was noticed that cracks formed in the portions of the dielectric material located proximate to the conductive traces 14a and 14b, as well as conductive pad 26a, and are shown generally as 60. It is believed that these cracks were the result of the differing coefficients of thermal expansion of the material from which the conductive traces 14a and 14b and 22a and the build-up layer 30 are formed. Specifically, the dielectric material build-up layer 30 is formed from dielectric is Nippon Steel Chemical V-259P coated to a maximum thickness of 20 to 30 microns. The Nippon Steel Chemical polymer is a photo definable cardo acrylate material and has a coefficient of thermal expansion of approximately 50×10$^{-6}$/° C. As mentioned above, it is preferred that the conductive traces 14a, 14b, as well as conductive pad 22a, are formed from a copper containing material. Typically the copper containing material is a chrome/copper stack deposited from, for example, a sputtering process as known to those skilled in the art. Other copper metallurgy (e.g. chrome/copper/chrome or copper/palladium among others) and can be deposited from a plating process as would also be known to those of skill in the art. Nonetheless, the coefficient of thermal expansion of the copper containing material will be commensurate for that of copper, i.e., approximately $16.5 \times 10^{-6}/°$ C. This results in the dielectric material 32 expanding and contracting at a greater rate than the copper containing material. The different rates of contraction causes the conductive traces 14a and 14b, as well as the conductive pad 22a, to exert a great amount of force per unit area against the dielectric material 32 when the dielectric material 32 contracts, thereby cracking the dielectric material 32.

Figure 2:
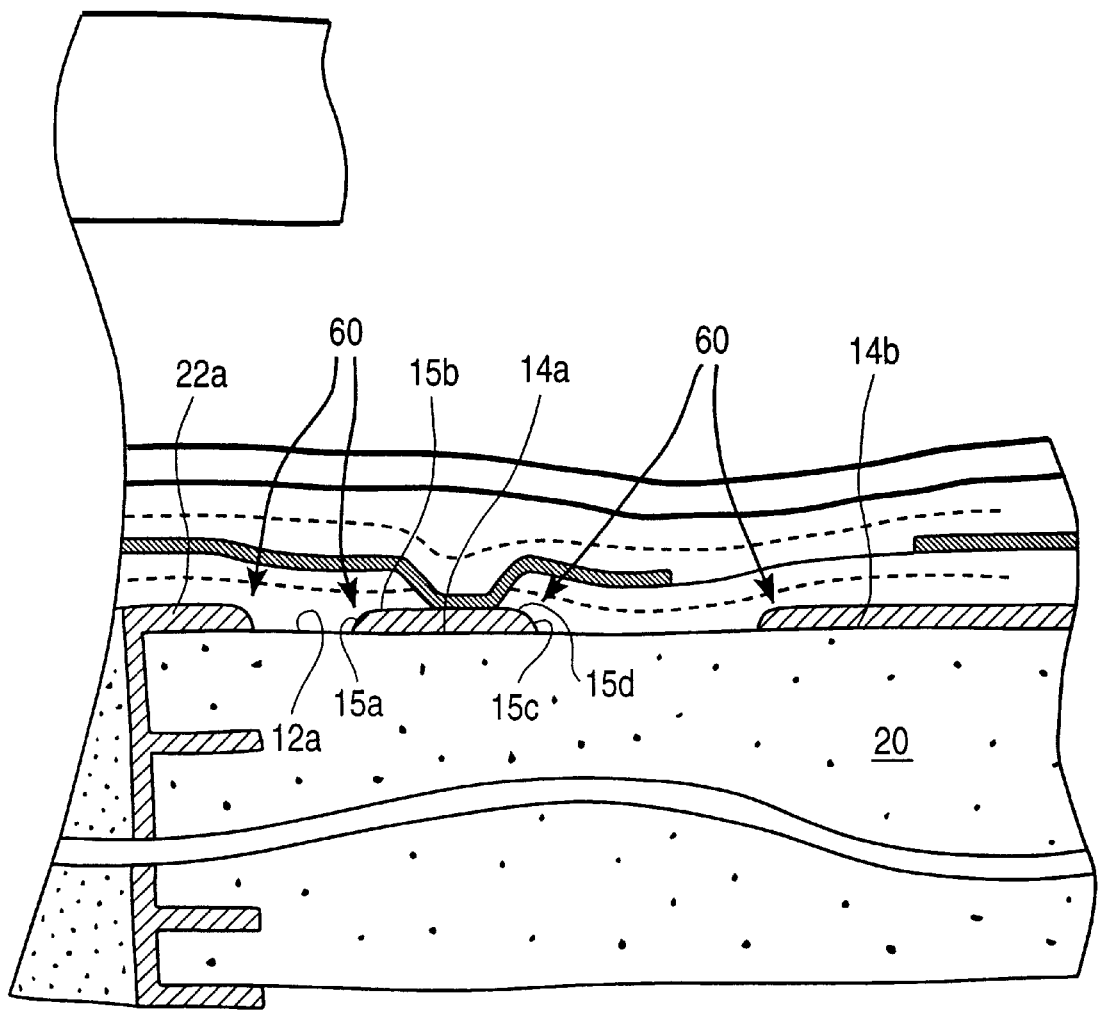
FIG. 2 is a detailed cross-sectional view of the circuit shown above in FIG. 1.
Figure 3:
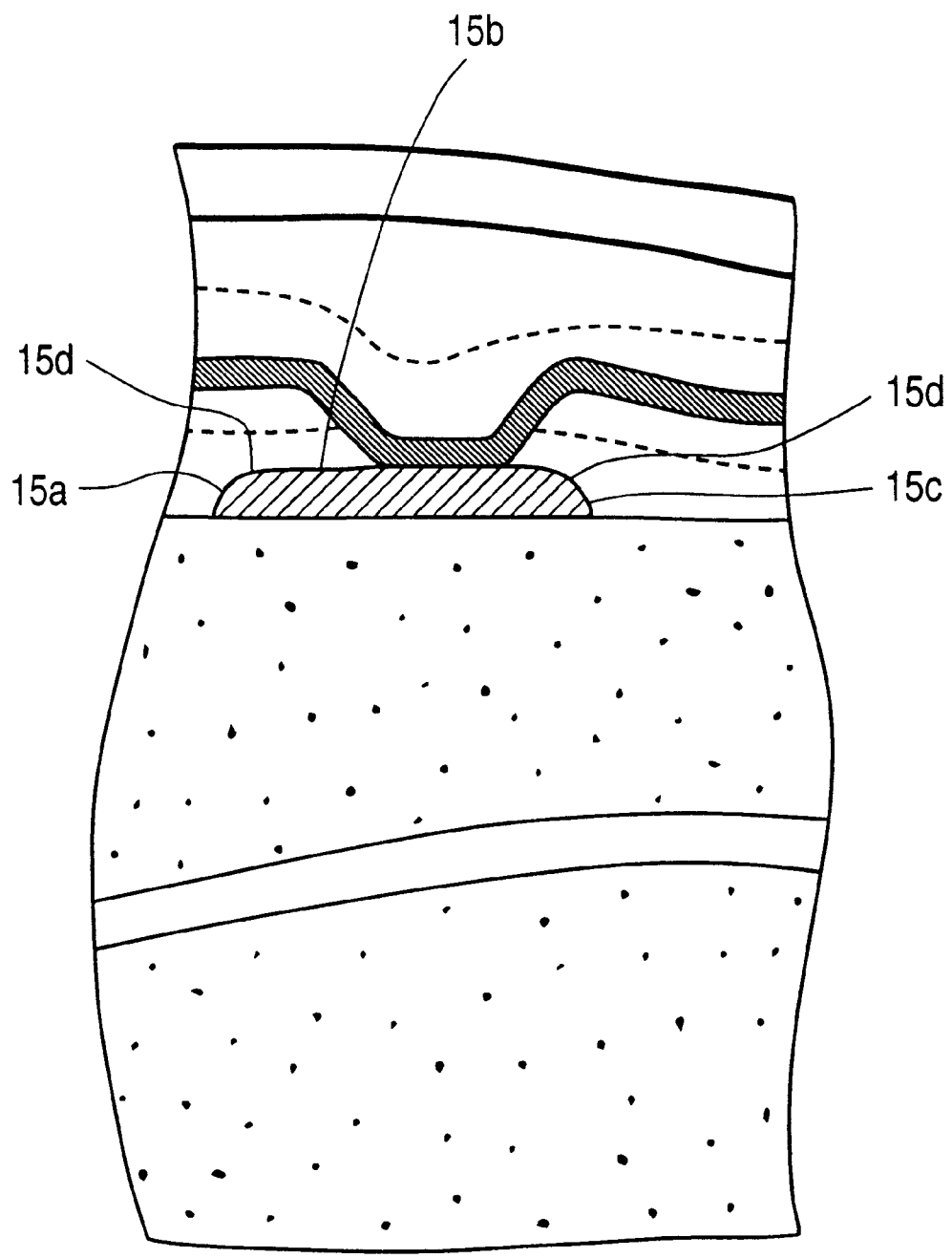
FIG. 3 is a further detailed cross-sectional view showing the features of a conductive trace shown in FIGS. 1 and 2, above.

Referring to FIGS. 2 and 3, to overcome this problem it was determined that the force per unit area exerted on the dielectric material 32 could be reduced by reducing the area of one or more of the sides of the conductive traces 14a, 14b and conductive 22a. As can be seen, each of the conductive traces 14a, 14b and conductive pad 22a has three exposed sides. For purposes of the present discussion only conductive trace 14a is discussed. The three exposed sides of conductive trace 14a are shown as 15a, 15b and 15c. Two of the sides, 15a and 15c, extend parallel to each other. Side 15b extends transversely to sides 15a and 15b. In this manner, sides 15a and 15c extend from the surface 12a and terminate proximate to side 15b, forming a junction 15d thereat.

It was recognized that the junction 15d is located proximate to the region 60 of failure in the dielectric material 32. The present invention reduces the failure in region 60 by providing the junction 15d with an arcuate profile. Specifically, it was recognized that the prior art junctions 115d, shown in FIG. 4, formed a right angle. It was thought that the force per unit area exerted on the region 160 could be reduced by reducing the angle formed the junction 115d. To that end, the area of the junction 15d, shown in FIGS. 2 and 3, was increased by providing the same with an arcuate profile. This resulted in a reduction in the area of sides 15a, 15b and 15c. With this structure, reduced is the force per unit area exerted on the dielectric material 32 by the conductive trace 14a, during thermal cycling of the structure 10.

To achieve the arcuate profile, it is preferred to use a mechanical vibratory polishing/grinding process. Typically, the laminate board 12 is provided with the wiring pattern already disposed thereon. The D/L structure 10 is then fabricated as a end user process after fabrication of the laminate board 12. To expeditiously and cost effectively achieve the arcuate profile of the conductive trace 14a of the wiring pattern, it was found effective to employ a vibratory abrading apparatus. An example of such a vibratory abrading apparatus is shown in U.S. Pat. No. 4,143,491. In such a device, a receptacle contains an abrading compound. For example, sand with a very fine grain structure that is agitated or oscillated at a predetermined frequency is present in the receptacle. By placing the laminate board 12 in the vibratory abrading apparatus, the edges of junction 15d of the conductive trace 14a is abraded to provide the aforementioned arcuate profile.

Figure 5:
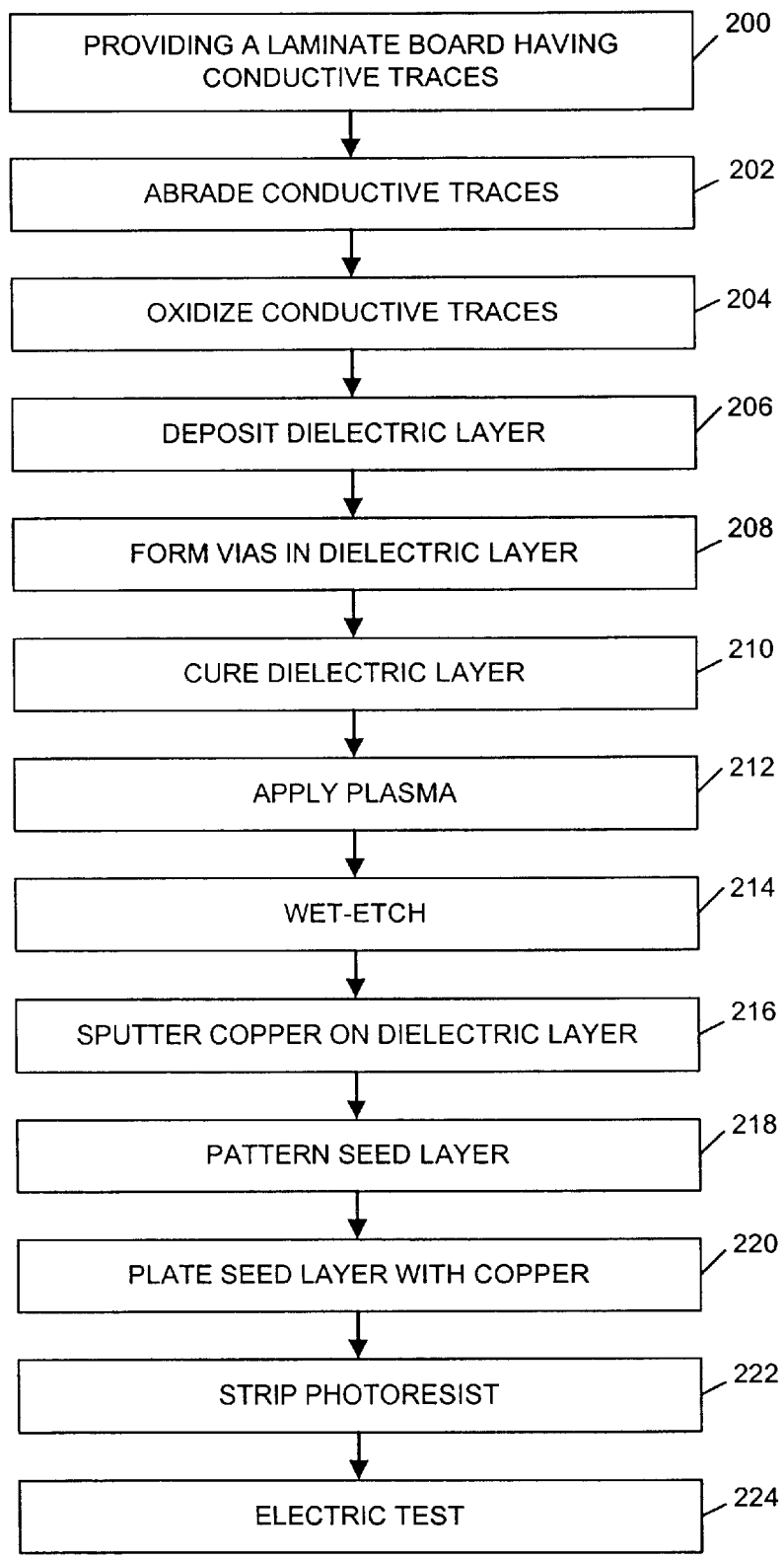
FIG. 5 is a flow diagram of a method employed to form the circuit identified above in FIGS. 1, 2 and 3 in accordance with the present invention.

Referring to FIGS. 1 and 5, the method for forming the D/L structure 10 includes providing the laminate board 12 having a wiring pattern thereon at step 200 and applying an identifier on the laminate board 12 using, among other things, as ablation process. For example, a laser may be employed to scribe the board as a function of the operation to be performed. The laminate board 12 may have any thickness desired. Preferably, the laminate board 12 is a one millimeter thick, measured between the opposing major surfaces 12a and 12b manufactured by Mitsubishi from BT HL810 resin dielectric. Typically, the wiring pattern consists of conductive traces, shown generally as conductive traces 14a, 14b and conductive pad 22a, having a thickness in the range of 20 to 30 microns. The thickness of the conductive traces is measured from the surface 12a to, for example, the side 15b of the conductive trace 14a.

At step 202, the laminate board 12 is placed in a vibratory abrading apparatus, as discussed above, to create the arcuate profile of the junctions of the copper conductive traces that comprising the wiring pattern. At step 204, the wiring pattern is cleaned using a standard process known in the art. Specifically, an antioxidant, such is employed that creates an oxide on the surface having a thickness of approximately 1,000 angstroms. At step 206, the dielectric material 32 is deposited on the surface 12a via spin coating so as to flow and planarize the wiring pattern adjacent thereto. To obtain the desired thickness, multiple layers may be spun-on to "build-up" the layer 30, as desired. In the preferred method, two layers of dielectric material 32 are spun-on to provide a thickness in the range of 25 to 50 microns, inclusive. At step 208, an image of a via pattern, such as for via 34, are formed in regions of dielectric material which are developed and the developer subsequently removed. At step 210, the laminate board 12 is then baked at 160° C. for 90 to cure and reflow the dielectric layer 32. At step 212, residue present on the dielectric layer is removed by placing the laminae board 12 in a plasma including oxygen source, such as $O_2$, and a fluorine source, such as $F_2$. The plasma also roughens the surface of the dielectric material 32 disposed opposite to surface 12a. At step 214, a wet etch is employed to remove the exposed surfaces of the oxide present on the wiring pattern. Additional copper is then sputtered onto the laminate board 12, coextensive with the area of the surface 12a at step 216. In this fashion, all exposed dielectric material 32 is covered with copper approximately 2,000 angstroms thick, forming a seed layer. The seed layer may be deposited by a number of different methods as would be known to a person of ordinary skill in the art. In one preferred embodiment the seed layer is a chrome/copper stack where the chrome layer is an adhesive layer approximately 200 angstroms thick, and the overlying copper layer is approximately 2000 angstroms thick, with each layer being deposited by a sputtering process.

At step 218, the seed layer is patterned by depositing a photoresist layer over the seed layer, exposing selected portions of the photoresist to UV light and developing the exposed layer to remove desired portions of the photoresist. Thereafter, a plating process is employed as step 220 wherein the laminate board 12 is immersed in a plating bath (e.g., in a SFT plating tool manufactured by Technics Corporation) and electrical contact is made to seed layer so that the seed layer acts as a cathode. Preferably, electrical contact is made to an exposed area of the seed layer on the periphery (i.e., outside the active area) of the laminate board 12.

In the plating bath, the laminate board 12 is positioned between two opposing anodes so that material can be plated on both surfaces 12a and 12b. This results in all exposed pads on both surfaces 12a and 12b being are plated. The exposed pads on the surface 12a include conductive contact 36. Because the method of the present invention utilizes a design rule in which all plated through holes are electrically connected to a conductive pad 36, plating should occur on the bottom pads connected to each plated through hole unless a defect (open) exists in the substrate.

At step 222 the photoresist is stripped and the copper etched leaving the wiring pattern desired. Thereafter, at step 224, an electrical test is performed to check the electrical characteristics of the wiring pattern. The aforementioned steps may be repeated to deposit an additional layer onto the structure 10. In addition, while not specifically mention above, various visual inspections may be performed during any of the aforementioned process steps to detect failures during fabrication.

Figure 4:
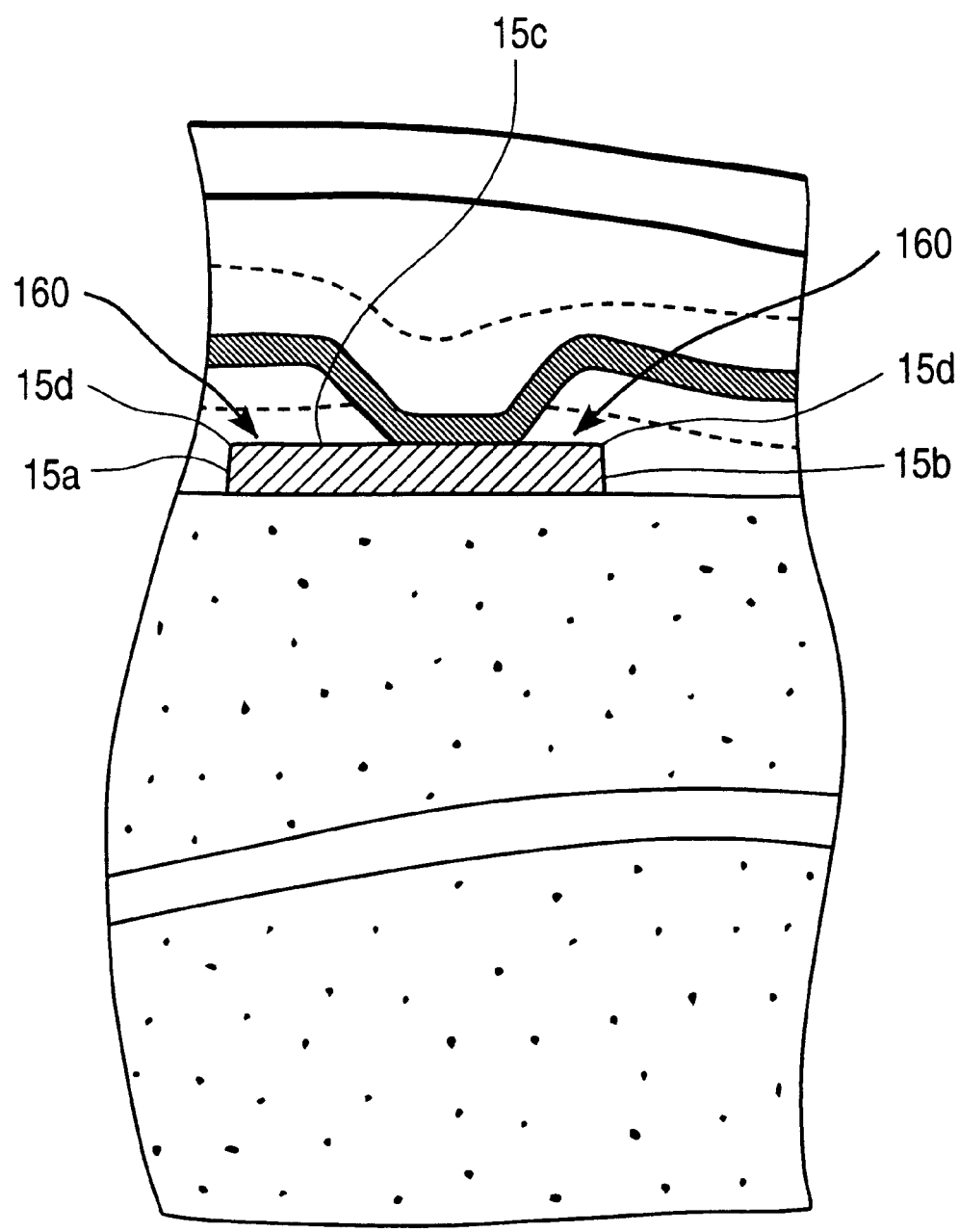
FIG. 4 is a detailed cross-sectional view showing the features of a conductive trace shown in accordance with a prior art structure.

The arcuate profile is demonstrated by comparing FIGS. 3 and 4, wherein junction 160 is shown having an arcuate profile and junction 60 forming a right angle. As shown, the profile of junction 160 results in a reduction in the area of the sides 115a, 115b and 115c of the conductive trace 114a, compared with the conductive trace 14a shown in FIG. 4.

Figure 6:
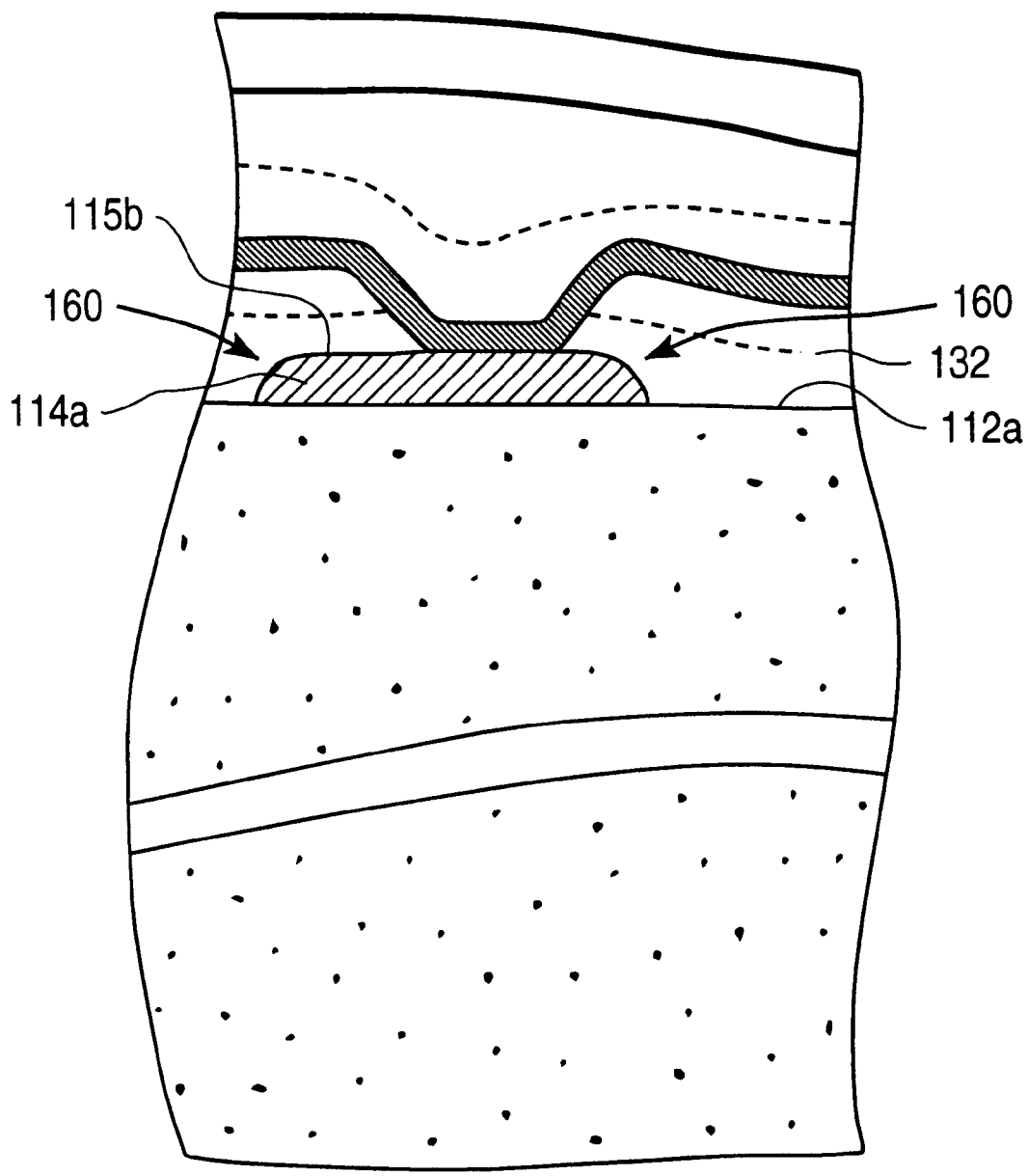
FIG. 6 is a detailed cross-sectional view showing the features of a conductive trace shown in accordance with an alternate embodiment of the present invention.

Referring to FIG. 6, in yet another embodiment of the present invention, the force per unit area exerted on the dielectric material 132 may be further reduced by polishing the wiring pattern on surface 112a of the laminated substrate 112. In this manner, the conductive traces on the surface 112a, such as conductive trace 114a, has a height, measured from the surface 112a to the side 115b that is reduced in the range of 10–20 microns. As a result, the area of both sides 115a and 115c are reduced. This was found to greatly decrease the failures in the regions 160 of dielectric material 132. Specifically, it is believed that by reducing the vertical separation of dielectric material 132 in region 160 from the surface 112a, there less stress exerted on the region due accelerated contraction of the dielectric material 132 during thermal cycling. As before, with less stress being exerted on region 160 by the wiring pattern, the dielectric material may be made much thinner and with less filler, thereby providing a lower dielectric constant to the structure and therefore, a lower impedance.

Figure 7:
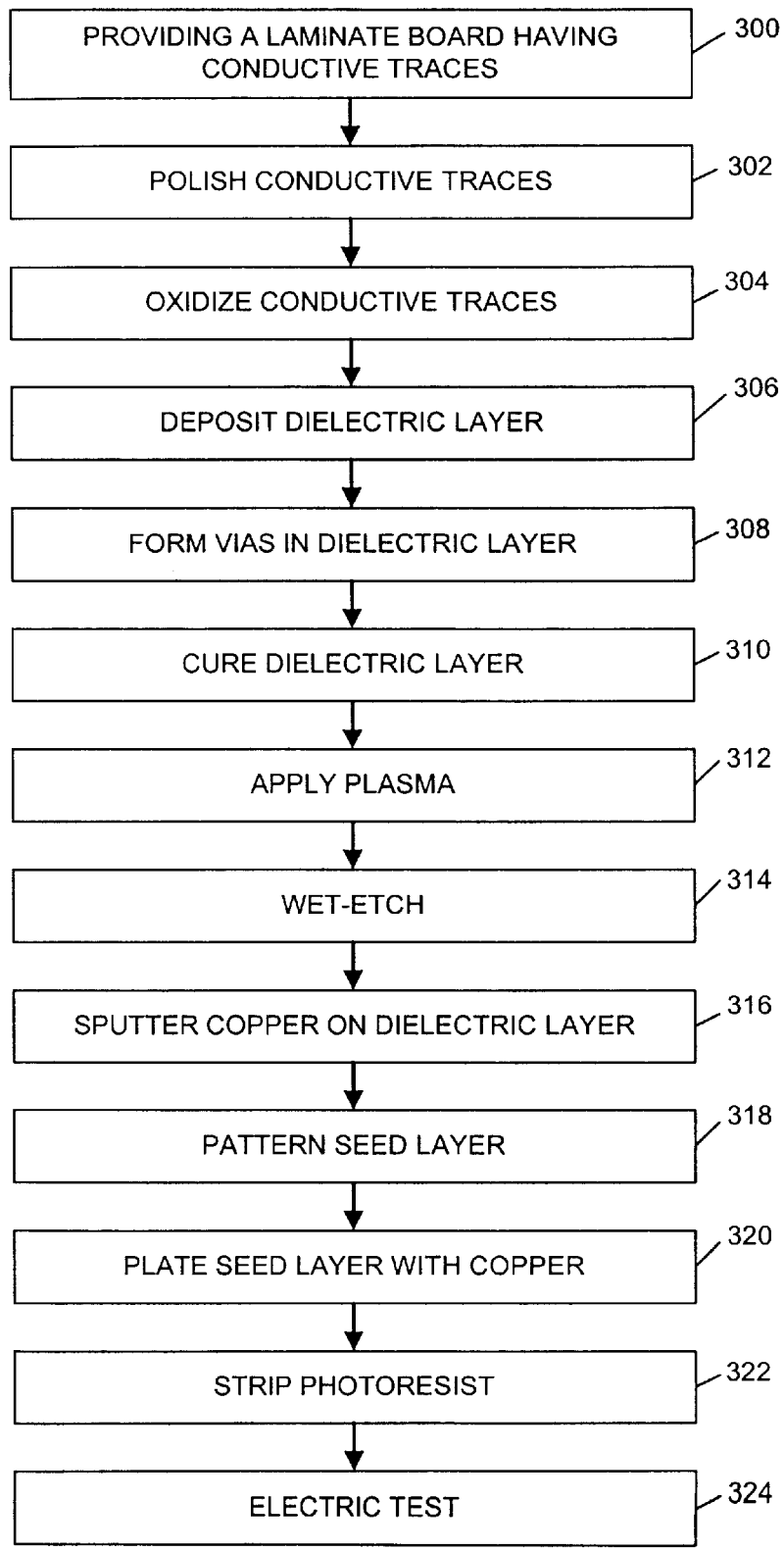
FIG. 7 is a flow diagram of a method employed to form the circuit identified above in FIGS. 1 and 2 in accordance with a second embodiment of the present invention.

Referring to FIG. 7, the process for fabricating structure 110 is similar to that recited above with respect to FIG. 5, except that step 202 is replaced by step 302 in which the wiring pattern on the board is polished by any means known in the art to a height in the range of 10 to 20 microns, inclusive. However, a height of 12 microns is preferred. The remaining steps of the process of FIG. 7, 300, 304, 306, 308, 310, 312, 314, 316, 318, 320, 322 and 324 are identical to steps 204, 206, 208, 210, 212, 214, 218, 220, 222 and 224, respectively, mentioned above with respect to FIG. 5. It should be understood, however, that both steps 302 and 202 could be combined in fabricating a common D/L structure 10. As a result, the method of fabrication would being identical to that discussed above with respect to FIG. 7 and including step 202 shown above in FIG. 5. The combining the junction with the arcuate profile, as discussed above would augment the stress reduction achieve by polishing the wiring pattern to the critical height in the range of 10 to 20 microns.

Referring again to FIG. 1, in yet another embodiment of the present invention, stress on the dielectric material 32 is reduced by establishing the coefficient of thermal expansion of an epoxy filler disposed within the through-hole 22 to be within a critical range. Specifically, it was found that the stress on the dielectric material proximate to the junction 17 was in part attributable to the expansion of the epoxy filler 23 disposed within the through-hole 22. It is believed that the isotropic nature of the expansion of the epoxy filler 23 coupled with the thickness of the laminate substrate 12 resulted in a great amount of force being exerted on the conductive material 24 disposed within the through-hole. This force is in turn transmitted to the dielectric material 32 causing failure of the same. This problem is not believe to have been seen before, because most laminate boards employed for structures similar to structure 10 are much less than one millimeter in thickness. As a result, the epoxy filler deposited in the though-hole is much less massive than that employed in the present invention. To reduce the stress exerted on the dielectric material, it is critical that the epoxy filler having a coefficient of thermal expansion in the range of $20$–$25 \times 10^{-6}/°$ C., inclusive.

It is to be understood that the above description is intended to be illustrative and not restrictive. Many embodiments will be apparent to those of skill in the art upon reviewing the above description. By way of example, each of the three embodiments have been described as being employed in an extended laminate structure independent of the remaining embodiments, but all may be included in a common structure or any combination of the two of the three embodiments may be included in a common structure while omitting the third embodiment. Finally, the conductive material has been described as being copper, but any conductor, such as aluminum, gold and the like, may be employed. Those skilled in the art will recognize other equivalent or alternative methods of reducing the stress as described above while remaining within the scope of the claims of the present invention. The scope of the inventions should, therefore, be determined not with reference to the above description, but should instead be determined with reference to the appended claims, along with the full scope of equivalents to which such claims are entitled.

What is claimed is:

1. A deposited-on-laminate structure, comprising:

a laminate printed circuit board;

a metallic wiring pattern disposed on said laminate printed circuit board;

a build-up layer of dielectric material over said wiring pattern, with said wiring pattern having a conductive trace with two sides extending from a common area, defining a junction, transversely to one another, with both said dielectric material and said signal trace having differing coefficients of thermal expansion that results in said junction exerting, on said build-up layer, a force per unit area when cycled over a range of temperature; and means for reducing said force per unit area exerted on said dielectric material by said junction upon both said build-up layer and said conductive trace cycling over said range of temperatures.

2. The structure as recited in claim 1 wherein said means for reducing said force per unit area includes a conductive trace having a junction with an arcuate profile.

3. The structure as recited in claim 1 wherein said conductive trace includes three sides, two of which extend from said laminate printed circuit board terminating proximate to said third side, with an interface of said third side with each of said two sides define forming said junction and an additional junction, with said reducing means including said junction and said additional junction having an arcuate profile.

4. The structure as recited in claim 1 further including an extended laminate layer disposed adjacent to said build-up layer.

5. The structure as recited in claim 1 further including a semiconductor circuit disposed adjacent to said extended laminate layer, with said extending laminate layer and said build-up layer including conductive lines placing said semiconductor circuit in electrical communication with said wiring pattern.

6. The structure as recited in claim 1 wherein said laminate printed circuit board has a laminate surface and said means for reducing force per unit area including said conductive trace having a height, measured from said laminate surface, to be within a range of 10 to 20 microns, inclusive.

7. The structure as recited in claim 6 wherein said height is 12 microns.

8. The structure as recited in claim 1 wherein said laminate printed circuit board has first and second opposing major surfaces with a through-hole extending therebetween, with said through-hole being coated with metallic material and said means for reducing force per unit area including a non-conductive filler disposed within said through-hole, with said filler having a coefficient of thermal expansion in the range of $20\text{--}25\times10\text{--}6/^\circ$ C.

9. A deposited-on-laminate structure, comprising:

a laminate printed circuit board;

a metallic wiring pattern disposed on said laminate printed circuit board;

a build-up layer of dielectric material over said wiring pattern, with said wiring pattern having a conductive trace with three exposed sides, two of which extend from said laminate printed circuit board, terminating proximate to said third side, defining two spaced-apart junctions at the interface of said third side with said two sides, with said spaced-apart junctions having an arcuate profile.

10. The structure as recited in claim 9 wherein said conductive trace has a height, measured from said laminate surface, in the range of 10 to 20 microns, inclusive.

11. The structure as recited in claim 9 wherein said laminate printed circuit board has first and second opposing major surfaces with a through-hole extending therebetween, with said through-hole being coated with metallic material, with a non-conductive filler disposed within said through-hole, said filler having a coefficient of thermal expansion in the range of $20\text{--}25\times10\text{--}6/^\circ$ C.

12. The structure as recited in claim 9 further including an extended laminate layered is posed adjacent to said build-up layer.

13. The structure as recited in claim 10 wherein said height is 12 microns.

14. The structure as recited in claim 9 further including a semiconductor circuit disposed adjacent to said extended laminate layer, with said extending laminate layer and said build-up layer including conductive lines placing said semiconductor circuit in electrical communication with said wiring pattern.

15. A deposited-on-laminate structure, comprising:

a laminate printed circuit board having first and second opposing major surfaces with a through-hole extending therebetween, with said through-hole being coated with metallic material, with a non-conductive filler disposed therein and having a coefficient of thermal expansion in the range of $20\text{--}25\times10\text{--}6/^\circ$ C.;

a metallic wiring pattern disposed on said laminate printed circuit board; and a build-up layer of dielectric material over said wiring pattern, with said wiring pattern having a conductive trace with three exposed sides, two of which extend from said laminate printed circuit board, terminating proximate to said third side, defining two spaced-apart junctions at the interface of said third side with said two sides, with said spaced-apart junctions having an arcuate profile and said conductive trace having a height, measured from said laminate surface, in the range of 10 to 20 microns, inclusive.

16. The structure as recited in claim 15 wherein said height is 12 microns.

17. The structure as recited in claim 16 further including an extended laminate layer disposed adjacent to said build-up layer.

18. The structure as recited in claim 17 further including a semiconductor circuit disposed adjacent to said extended laminate layer, with said extending laminate layer and said build-up layer including conductive lines placing said semiconductor circuit in electrical communication with said wiring pattern.

* * * * *